(12) United States Patent
Chen

(10) Patent No.: US 10,971,437 B2
(45) Date of Patent: Apr. 6, 2021

(54) CHIP PACKAGE STRUCTURE AND METHOD FOR MANUFACTURING THE SAME

(71) Applicant: Silergy Semiconductor Technology (Hangzhou) LTD, Hangzhou (CN)

(72) Inventor: Shijie Chen, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/152,533

(22) Filed: Oct. 5, 2018

(65) Prior Publication Data

US 2019/0115291 A1  Apr. 18, 2019

(30) Foreign Application Priority Data

Oct. 13, 2017 (CN) .......................... 201710952866.6

(51) Int. Cl.
| | |
|---|---|
| *H01L 23/495* | (2006.01) |
| *H01L 23/00* | (2006.01) |
| *H01L 21/56* | (2006.01) |
| *H01L 23/31* | (2006.01) |

(52) U.S. Cl.
CPC ........ *H01L 23/49575* (2013.01); *H01L 21/56* (2013.01); *H01L 23/4952* (2013.01); *H01L 23/49503* (2013.01); *H01L 23/49551* (2013.01); *H01L 23/49562* (2013.01); *H01L 24/05* (2013.01); *H01L 24/48* (2013.01); *H01L 24/49* (2013.01); *H01L 23/3107* (2013.01); *H01L 23/49541* (2013.01); *H01L 2224/05553* (2013.01); *H01L 2224/48091* (2013.01); *H01L 2224/48247* (2013.01); *H01L 2224/4917* (2013.01); *H01L 2224/49113* (2013.01);

(Continued)

(58) Field of Classification Search
CPC . H01L 2924/00014; H01L 2224/48091; H01L 2224/45099; H01L 21/56; H01L 2224/05553; H01L 2224/48247; H01L 2224/49113; H01L 2224/4917; H01L 23/3107; H01L 23/49503; H01L 23/4952; H01L 23/49541; H01L 23/49551; H01L 23/49562; H01L 23/49575; H01L 24/05; H01L 24/48; H01L 24/49
See application file for complete search history.

(56) References Cited

U.S. PATENT DOCUMENTS

| | | | |
|---|---|---|---|
| 7,193,302 | B2 | 3/2007 | Tseng |
| 8,836,093 | B2 | 9/2014 | Tan |
| 8,866,273 | B2 | 10/2014 | Tan |

(Continued)

*Primary Examiner* — Robert G Bachner
(74) *Attorney, Agent, or Firm* — Michael C. Stephens, Jr.

(57) ABSTRACT

A chip package structure can include: a lead frame having a plurality of pins, a first die pad, and a second die pad; a first die and a second die, where a first surface of the first die is installed on the first die pad, and a first surface of the second die is installed on the second die pad; a plurality of pads installed on a second surface of the first die and a second surface of the second die; and bonding wires including a first set of bonding wires with each having one terminal connected to pads of the first die, and a second set of bonding wires with each having one terminal connected to pads of the second die for connectivity between the first die and the second die, and between the plurality of pins and the first die and the second die.

20 Claims, 7 Drawing Sheets

(52) U.S. Cl.
CPC ............... *H01L 2924/00014* (2013.01); *H01L 2924/13091* (2013.01)

(56) References Cited

U.S. PATENT DOCUMENTS

| | | |
|---|---|---|
| 9,024,440 B2 | 5/2015 | Tan |
| 9,123,629 B2 | 9/2015 | Tan |
| 9,373,567 B2 | 6/2016 | Tan |
| 2003/0034563 A1* | 2/2003 | Reyes ..................... H01L 24/49 257/777 |
| 2015/0214200 A1 | 7/2015 | Tan et al. |
| 2015/0357270 A1* | 12/2015 | Yap ......................... H01L 25/16 257/668 |
| 2016/0365257 A1 | 12/2016 | Tan |
| 2017/0110441 A1 | 4/2017 | Tan |
| 2017/0294369 A1* | 10/2017 | Kawashima ...... H01L 23/49568 |

* cited by examiner

CHIP PACKAGE STRUCTURE AND METHOD FOR MANUFACTURING THE SAME

RELATED APPLICATIONS

This application claims the benefit of Chinese Patent Application No. 201710952866.6, filed on Oct. 13, 2017, which is incorporated herein by reference in its entirety.

FIELD OF THE INVENTION

The present invention generally relates to semiconductor technology, and more particularly to chip packaging methods and structures.

BACKGROUND

Wire bonding technology has been widely used in various chip package structures. Such chip package structures may include a lead frame and one or more dies on the lead frame. Wire bonding can be utilized in order to realize electrical connectivity between dies, as well as between the die and the lead frame inside of the chip package structure.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
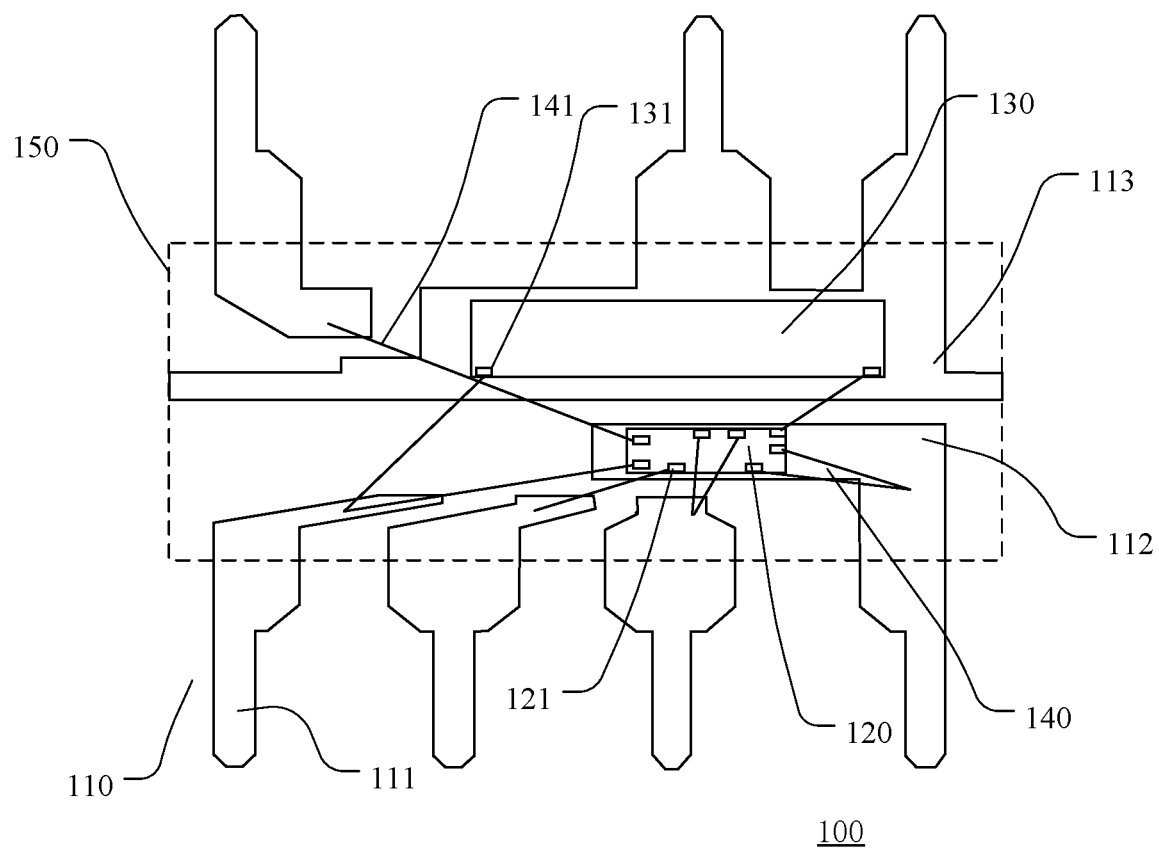
FIG. 1 is a top view diagram of an example chip package structure.
Figure 2A:
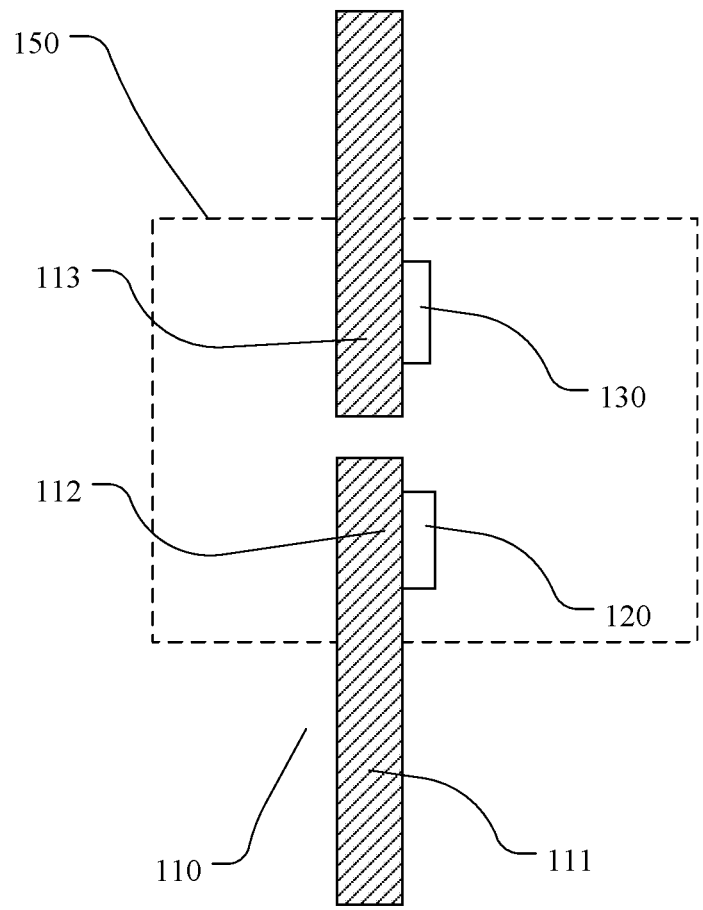
FIGS. 2A and 2B are side view diagrams of the example chip package structure of FIG. 1.
Figure 2B:
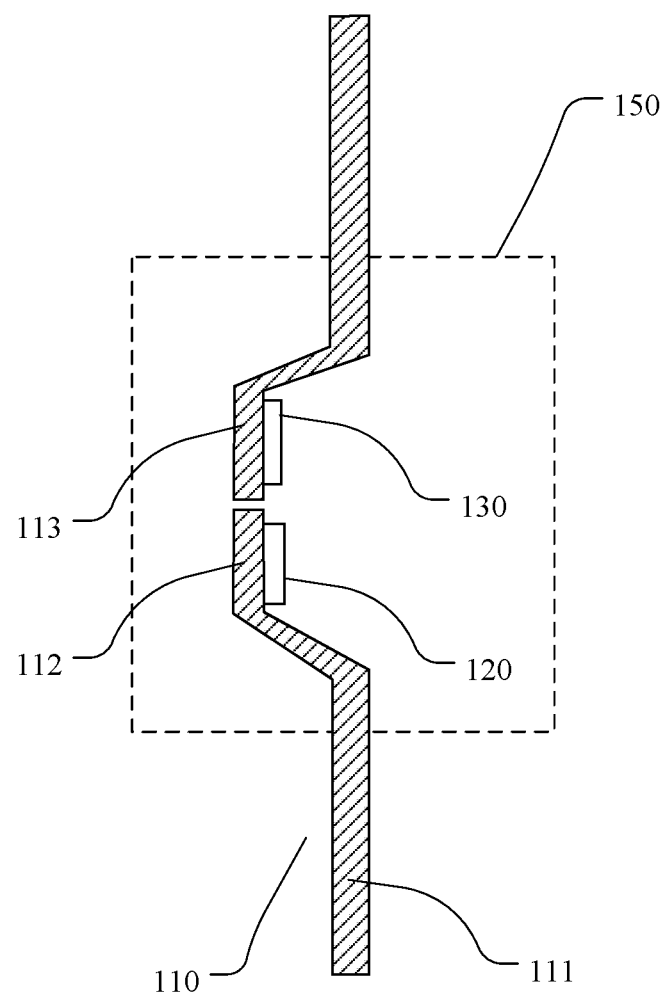

Referring now to FIG. 1, shown is a top view diagram of an example chip package structure. Referring also to FIGS. 2A and 2B, shown are side view diagrams of the example chip package structure of FIG. 1. In this example package structure 100, chips 120 and 130 may be packaged using a dual-in-line package technology. Lead frame 110 can include pins 111, die pads 112 and 113 separated from each other, die 120 adhered on die pad 112, die 130 adhered on die pad 113. Also, dies/chips 120 and 130 can respectively include pads 121 and pads 131, respectively. Wires 140 can be utilized in order to connect chip 120 and chip 130 to each other, and to connect at least a portion of the pads of chips 120 and 130 to pins 111. In example chip package structure 100, die pads 112 and 113 may be separated from each other and located on the main plane of lead frame 110, as shown in FIG. 2A. In another example package structure, die pads 112 and 113 may be separated from each other and be lower than the main plane of lead frame 110 in order to facilitate the wire bonding operation, as shown in FIG. 2B.

In the package structure described above, die pads 112 and 113 may be on the same plane, and the upper surface of chips 120 and 130 can be substantially flush. In the process of wire bonding, if there are intersecting wires or spanning-chip wires, the bonding wires that are adjacent to each other are likely to cause a "punching wire" phenomenon due to the reduced distance. In the process of injecting the encapsulant, since two or more bonding wires are intersected in the same plane, the adjacent bonding wires are relatively close to each other, and the encapsulant is generally injected from both the left and right sides of package structure, possible occurrence of the "punching wire" phenomenon can be increased. As a result, the yield of the chip may be reduced, the service life of the chip may be reduced, and manufacturing costs may increase.

In one embodiment, a chip package structure can include: (i) a lead frame having a plurality of pins, a first die pad, and a second die pad; (ii) a first die and a second die, where a first surface of the first die is installed on the first die pad, and a first surface of the second die is installed on the second die pad; (iii) a plurality of pads installed on a second surface of the first die and a second surface of the second die; (iv) a plurality of bonding wires including a first set of bonding wires with each having one terminal connected to pads of the first die, and a second set of bonding wires with each having one terminal connected to pads of the second die for connectivity between the first die and the second die, and between the plurality of pins and the first die and the second die; and (v) where the pins of the lead frame and the first die pad are located on a main plane, a plane of the second die pad is lower than the main plane, and at least one bonding wire of the first set of bonding wires spans the second die or at least one bonding wire of the second set of bonding wires.

Figure 3:
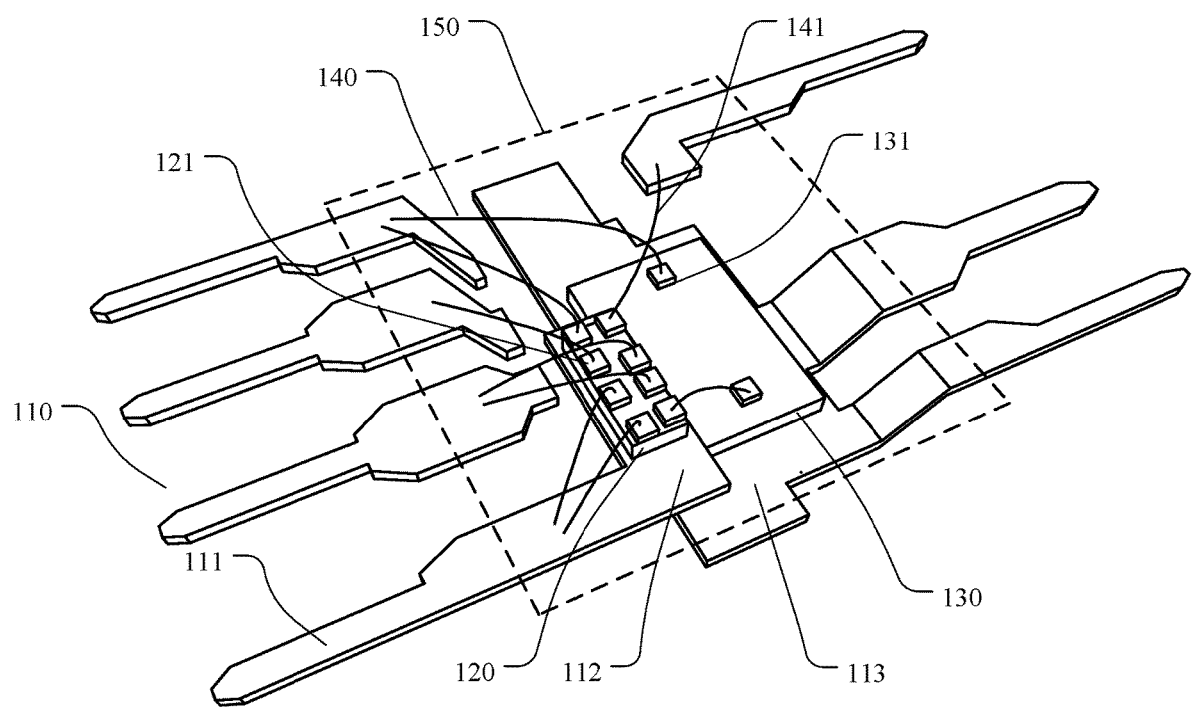
FIG. 3 is a perspective view diagram of an example chip package structure, in accordance with embodiments of the present invention.
Figure 4:
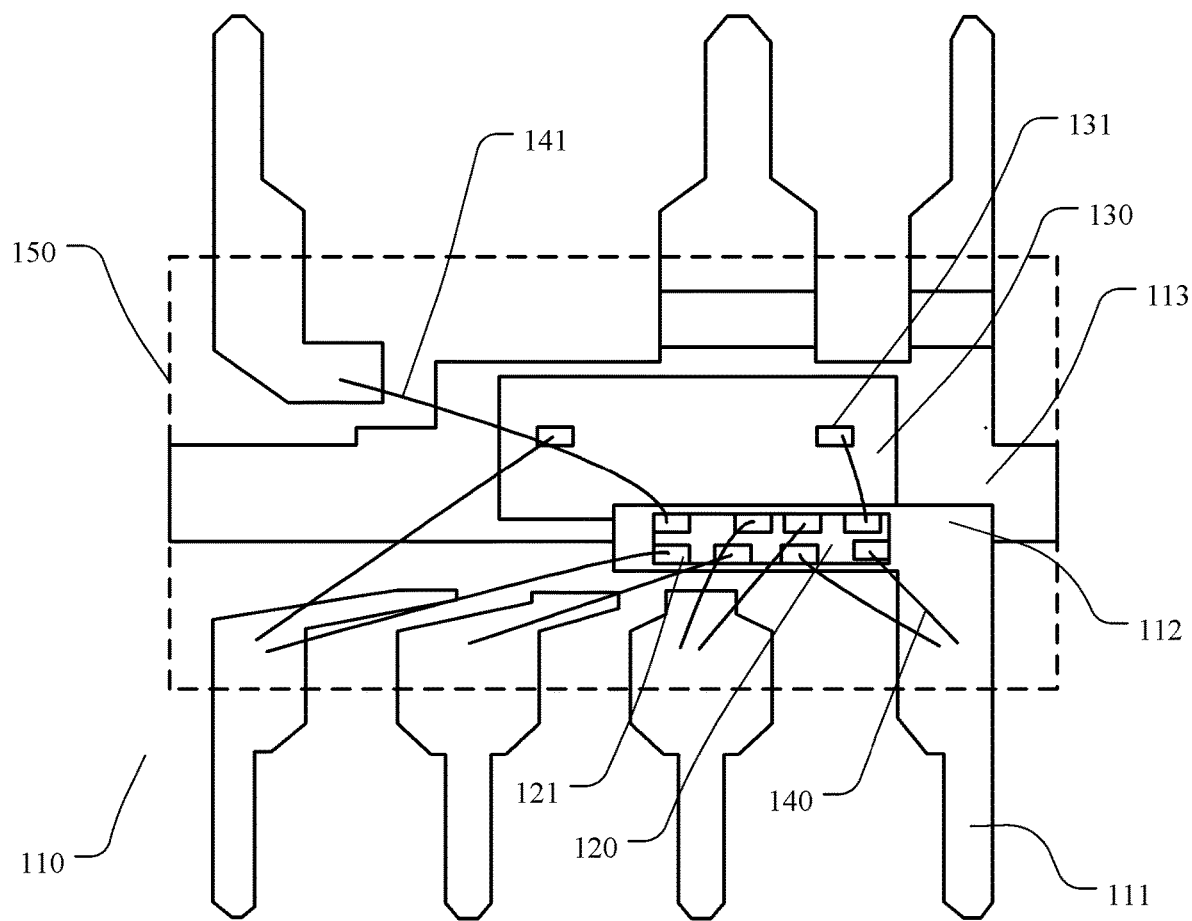
FIG. 4 is a top view diagram of an example chip package structure, in accordance with embodiments of the present invention.
Figure 5:
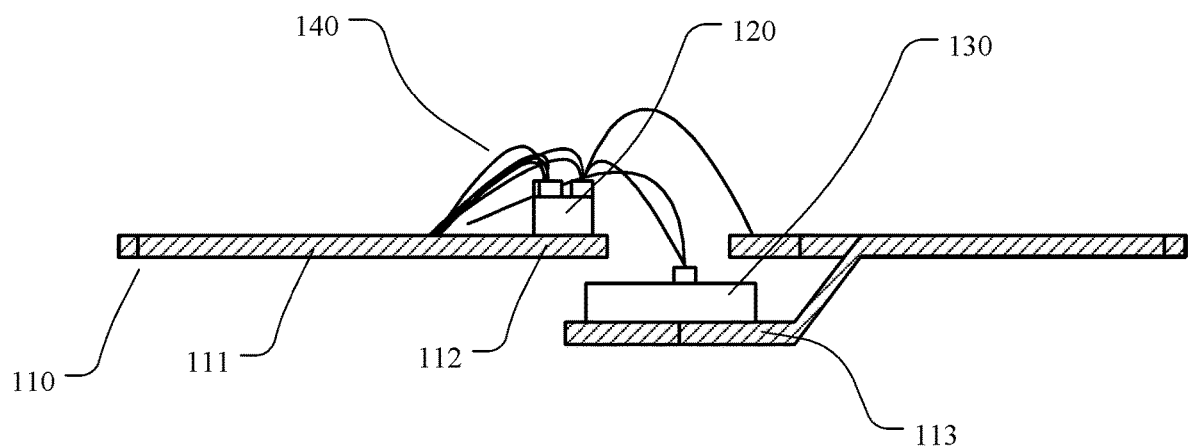
FIG. 5 is a side view diagram of an example chip package structure, in accordance with embodiments of the present invention.

Referring now to FIGS. 3, 4, and 5, shown are perspective view, top view, and side view diagrams, respectively, of an example chip package structure, in accordance with embodiments of the present invention. For the sake of clarity, the boundary of encapsulant 150 is shown in dashed lines in the drawings. For example, encapsulant 150 may cover die 120, die 130, bonding wires 140, and at least a portion of lead frame 110.

In particular embodiments, chip package structure 200 can include lead frame 110 having pins 111, die pad 112, die pad 113, die 120, die 130, and bonding wires 140. Here, lead frame 110 can be made of copper, and different portions of the lead frame can be formed by a stamping process. A first surface of die 120 may be installed on die pad 112, a first surface of die 130 may be installed on die pad 113, and pads may be installed on a second surface of die 120 and a second surface of die 130. The bonding wires can include a first set of bonding wires having one terminal coupling to pads of die 120, and a second set of bonding wires having one terminal coupling to pads of die 130. Therefore, connectivity between die 120 and die 130, and connectivity between each of die 120 and die 130 and pins 111 can be achieved.

Pins 111 of lead frame 110 and die pad 112 may be located on a main plane, whereby a plane of die pad 113 can be lower than the main plane. At least one bonding wire 141 of the first set of bonding wires may span die 130 or at least one bonding wire of the second set of bonding wires. For example, chip package structure 200 can be a switching power supply, whereby the "first" die can be control chip 120, and the "second" die can be power transistor 130. Also for example, power transistor 130 can be a power metal-oxide-semiconductor field-effect transistor (MOSFET), and die pads 112 and 113 may be separated from each other. In an alternative example, die pads 112 and 113 can be integrally formed.

For example, pins 111 of lead frame 110 can include 7 pins, one pin of which is connected to die pad 112, and two pins of which are connected to die pad 113. The adhesion between die pad 112 and control chip 120, and the adhesion between second die pad 113 and power transistor 130 can each be an insulating adhesion (e.g., an epoxy resin). For example, the insulating adhesive can be formed on die pads 112 and 113 by a dispensing process, and the epoxy resin may have a specific thickness in order to ensure chip performance.

The height difference between die pads 112 and 113 may be greater than a thickness of power transistor 130, such that the pads on control chip 120 are not located on the same surface as the pads of power transistor 130. Therefore, one terminal of the set of bonding wires connected to control chip 120, and one terminal of the set of bonding wires connected to power transistor 130 may not be located on the same plane, in order to avoid a short circuit between bonding wires that may be caused by mutual contact of intersecting bonding wires. The lateral dimension of power transistor 130 may be greater than the lateral dimension of control chip 120. Also, the number of pads of power transistor 130 may be less than the number of pads of control chip 120. For example, pads 121 on control chip 120 can be 8 pads that are arranged in two parallel columns, and pads 131 on power transistor 130 can be 2 pads that are located on the both ends of the second surface of power transistor 130. At least a portion of die pad 113 may extend below die pad 112 such that control chip 120 is at least partially stacked above power transistor 130. In particular embodiments, the area of power transistor 130 can be increased in order to improve the driving ability of the chip.

In particular embodiments, a chip package structure can include die pads 112 and 113 on different sides of lead frame 110. Pins 111 of lead frame 110 and die pad 112 may be located on a main plane, and a plane of die pad 113 may be lower than the main plane. In this example chip package structure, because die pads 112 and 113 are not located on the same plane, bonding wires 140 on die pads 112 and 113 may not be on the same plane. Therefore, in the process of wire bonding, spanning-chip wires will not be on the same plane, and the bonding wires can be prevented from intersecting and/or the adjacent bonding wires can be prevented from being close to each other, thereby reducing the possibility of a "punching wire" occurrence.

During the process of injecting the encapsulant, the encapsulant may be injected from the left and right sides of the chip package structure. This approach can reduce the possibility of a short circuit or punching wire occurrence that might be caused by contact of adjacent or intersecting bonding wires 140 due to the influence of the encapsulant on the wires. In particular embodiments, the quality and speed of wire bonding can effectively be improved, the potential failure probability of the product can be reduced, and the yield of the processing cycle may be improved, thereby in turn improving the quality and reliability of the overall product.

For example, chip package structure can be configured as a switching power supply. A gate driver of control chip 120 can connect to a gate of power transistor 130 by a bonding wire, a source of power transistor 130 can connect to one pin by a bonding wire, and the drain of power transistor 130 may be adhered on die pad 113 by a conductive adhesive layer. The conductive adhesive layer may provide a thermal conduction path and an electrical connection path between die pad 113 and power transistor 130.

In addition, the chip package structure of particular embodiments can include encapsulant 150 to cover control chip 120, power transistor 130, bonding wires 140, and at least a portion of lead frame 110. Here, encapsulant 150 can include first and second surfaces opposite to each other, and side surfaces connecting the first and second surfaces. Pins may be exposed from the side surfaces of encapsulant 150. For example, the chip package structure can be configured as a dual in-line package. Also for example, the encapsulant can be an epoxy resin polymer, which may fully encapsulate the wire-bonded chip and lead frame, and can be generated by a modular process for relatively low material cost and light weight. For example, the polymer after encapsulation using an epoxy resin polymer is stably invariant, ion-purified, and processed at temperatures up to 250° C. One aspect of epoxy resin is that it absorbs less moisture, and a filler can be added to reduce the thermal coefficient of expansion (TCE) to match that of the lead frame and the chip, thereby ensuring chip performance.

In one embodiment, a method of manufacturing a chip package structure can include: (i) installing a first die on a first die pad of a lead frame, and installing a second die on a second die pad of the lead frame, where a plurality of pins of the lead frame and the first die pad are located on a main plane, and a plane of the second die pad is lower than the main plane; (ii) bonding by a plurality of bonding wires to connect the first die and the second die, and to connect the plurality of pins to the first die and the second die; and (iii) covering the first die, the second die, the plurality of bonding wires, and at least a portion of the lead frame with an encapsulant; (iv) where the plurality of bonding wires includes a first set of bonding wires with each having one terminal connected to pads of the first die, and a second set of bonding wires with each having one terminal connected to pads of the second die, and at least one bonding wire of the first set of bonding wires spans the second die or at least one bonding wire of the second set of bonding wires.

Figure 6:
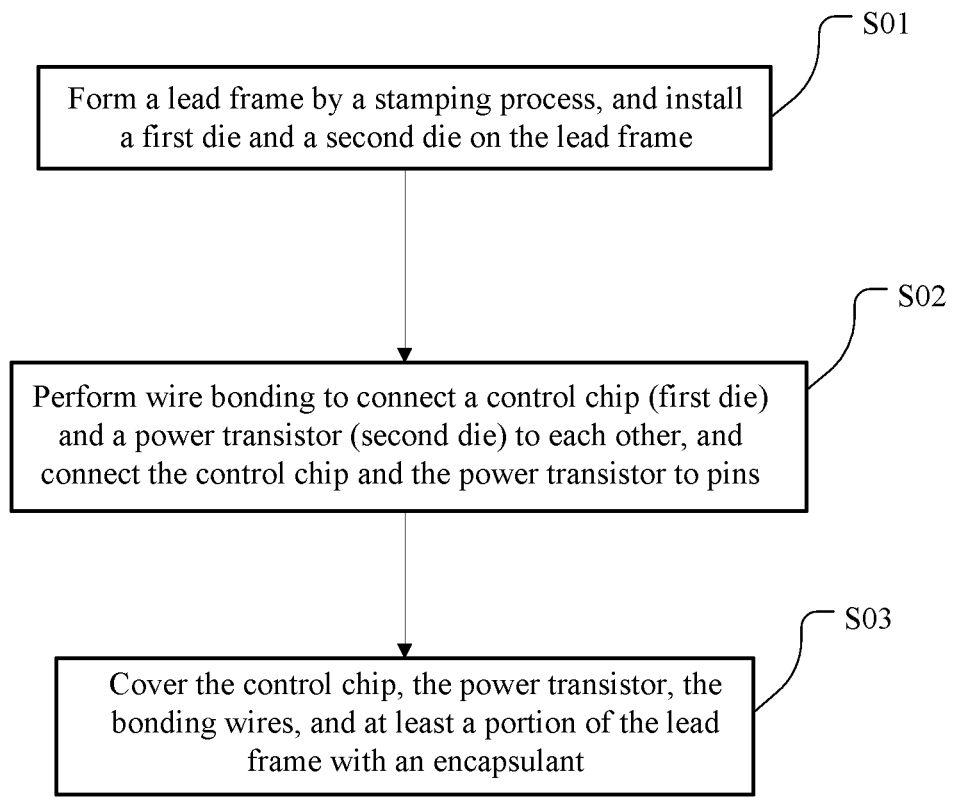
FIG. 6 is a flow diagram of an example method of manufacturing the example chip package structure, in accordance with embodiments of the present invention.

Referring now to FIG. 6, shown is a flow diagram of an example method of manufacturing the example chip package structure, in accordance with embodiments of the present invention. In this example, at S01, lead frame 110 may be formed by a stamping process, and die 120 (e.g., a control chip) and die 130 (e.g., a power transistor) can be installed on lead frame 110. Die 120 may be located on a main plane of lead frame 110, and a plane of die 130 can be lower than the main plane. Lead frame 110 can include pins 111, and die pads 112 and 113. Pins 111 of lead frame 110 and die pad 112 may be located on the main plane, and a plane of die pad 113 can be lower than the main plane. The installing of die 120 and die 130 may include adhering a first surface of die 120 on die pad 112, and adhering a first surface of die 130 on die pad 113.

For example, the height difference between die pad 112 and die pad 113 can be greater than a thickness of power transistor 130. The lateral dimension of power transistor 130 may be greater than the lateral dimension of control chip 120. The number of pads of power transistor 130 can be less than the number of pads of control chip 120. Here, if at least a portion of die pad 113 extends below die pad 112, power transistor 130 may be inserted from the side surface of lead frame 110 to a position between die pads 112 and 113. Control chip 120 can be installed on die pad 112 such that control chip 120 is at least partially stacked above power transistor 130.

In S02, bonding wires 140 can be used to connect control chip 120 and power transistor 130 to each other, and each of control chip 120 and power transistor 130 to pins 111. Bonding wires 140 can include first and second sets of bonding wires, where one terminal of the first set of bonding wires can connect to pads of control chip 120, and one terminal of the second set of bonding wires can connect to pads of power transistor 130. At least one bonding wire 141 of the first set of bonding wires may span power transistor 130 or at least one bonding wire of the second set of bonding wires. The wire bonding process can include a gate driver of control chip 120 being connected to a gate of power transistor 130 by a bonding wire, a source of power transistor 130 being connected to one pin by a bonding wire, and a drain of power transistor 130 being adhered/connected on die pad 113 by a conductive adhesive layer.

In S03, control chip 120, power transistor 130, bonding wires 140, and at least a portion of lead frame 110 may be covered with encapsulant 150. In the covering, encapsulant 150 can include first and second surfaces opposite to each other, and side surfaces connecting the first and second surfaces. Pins 111 may be exposed from the side surfaces of encapsulant 150. In addition, the example chip package structure may be configured as a dual in-line package.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A chip package structure, comprising:
a) a lead frame having a plurality of pins, a first die pad, and a second die pad, wherein said plurality of pins comprises a first set of pins comprising a pin extension on a first side of said lead frame, and a second set of pins on a second side of said lead frame, wherein said first side is opposite to said second side, said first die pad is connected to at least one of said second set of pins, and said second die pad is connected to at least one of said first set of pins;
b) a first die and a second die, wherein a first surface of said first die is installed on said first die pad, and a first surface of said second die is installed on said second die pad;
c) a plurality of pads installed on a second surface of said first die and a second surface of said second die;
d) a plurality of bonding wires comprising a first set of bonding wires with each having one terminal connected to pads of said first die, and a second set of bonding wires with each having one terminal connected to pads of said second die for connectivity between said first die and said second die, and between said plurality of pins and said second die;
e) wherein said plurality of pins of said lead frame and said first die pad are located on a main plane, a plane of said second die pad is lower than said main plane, and at least one bonding wire of said first set of bonding wires spans said second die and connects to said pin extension; and
f) wherein at least a portion of said second die pad extends below said first die pad such that said first die partially overlaps said second die, and said pin extension extends toward the inside of the chip package structure on said main plane and partially exceeds said second die.

2. The chip package structure of claim 1, wherein the height difference between said first and second die pads is greater than a thickness of said second die.

3. The chip package structure of claim 1, wherein a lateral dimension of said second die is greater than a lateral dimension of said first die.

4. The chip package structure of claim 1, wherein the number of pads of said second die is less than the number of pads of said first die.

5. The chip package structure of claim 1, wherein a gate driver of said first die is connected to a gate of said second die by one of said plurality of bonding wires, a source of said second die is connected to one of said plurality of pins by another of said plurality of bonding wires, and a drain of said second die is adhered on the second die pad by a conductive adhesive layer.

6. The chip package structure of claim 1, wherein said portion of said second die pad extends below said first die pad in order to accommodate an area of said second die being greater than an area of said first die.

7. The chip package structure of claim 1, further comprises an encapsulant covering said first die, said second die, said plurality of bonding wires, and at least a portion of said lead frame, wherein said encapsulant comprises first and second surfaces opposite to each other, and side surfaces connecting said first and second surfaces, wherein said plurality of pins of said lead frame are exposes from said side surfaces of said encapsulant.

8. The chip package structure of claim 1, wherein at least one bonding wire of said first set of bonding wires spans at least one bonding wire of said second set of bonding wires.

9. The chip package structure of claim 1, being configured as a switching power supply, wherein said first die comprises a control chip, and said second die comprises a power transistor.

10. The chip package structure of claim 1, being configured as a dual-in-line package.

11. A method of manufacturing a chip package structure, the method comprising:
a) installing a first die on a first die pad of a lead frame, and installing a second die on a second die pad of said lead frame, wherein a plurality of pins of said lead frame and said first die pad are located on a main plane, and a plane of said second die pad is lower than said main plane, wherein said plurality of pins comprises a first set of pins comprising a pin extension on a first side of said lead frame, and a second set of pins on a second side of said lead frame, wherein said first side is opposite to said second side, said first die pad is connected to at least one of said second set of pins, and said second die pad is connected to at least one of said first set of pins;

b) bonding by a plurality of bonding wires to connect said first die and said second die, and to connect said plurality of pins to said first die and said second die;

c) covering said first die, said second die, said plurality of bonding wires, and at least a portion of said lead frame with an encapsulant;

d) wherein said plurality of bonding wires comprises a first set of bonding wires with each having one terminal connected to pads of said first die, and a second set of bonding wires with each having one terminal connected to pads of said second die, and at least one bonding wire of said first set of bonding wires spans said second die and connects to said pin extension; and e) wherein at least a portion of said second die pad extends below said first die pad such that said first die partially overlaps said second die, and said pin extension extends toward the inside of the chip package structure on said main plane and partially exceeds said second die.

12. The method of claim 11, wherein said installing said first die and said second die comprises installing a first surface of said first die on said first die pad, and installing a first surface of said second die on said second die pad.

13. The method of claim 11, wherein said installing said second die comprises inserting said second die from side surfaces of said lead frame to a position between said first and second die pads.

14. The method of claim 11, wherein the height difference between said first and second die pads is greater than a thickness of said second die.

15. The method of claim 11, wherein a lateral dimension of said second die is greater than a lateral dimension of said first die.

16. The method of claim 11, wherein the number of pads of said second die is less than the number of pads of said first die.

17. The method of claim 11, wherein said bonding process comprises connecting a gate driver of said first die to a gate of said second die by one of said plurality of bonding wires, connecting a source of said second die to one of said plurality of pins by another of said plurality of bonding wires, and adhering a drain of said second die on the second die pad by a conductive adhesive layer.

18. The method of claim 11, wherein said encapsulant comprises first and second surfaces opposite to each other, and side surfaces connecting said first and second surfaces, wherein said plurality of pins of said lead frame are exposes from said side surfaces of said encapsulant.

19. The method of claim 11, wherein said chip package structure is configured as a dual-in-line package.

20. The method of claim 11, wherein said portion of said second die pad extends below said first die pad in order to accommodate an area of said second die being greater than an area of said first die.

* * * * *